US012249546B2

(12) United States Patent
Kajisa et al.

(10) Patent No.: US 12,249,546 B2
(45) Date of Patent: Mar. 11, 2025

(54) ELECTRONIC ELEMENT MOUNTING SUBSTRATE AND ELECTRONIC DEVICE

(71) Applicant: KYOCERA Corporation, Kyoto (JP)

(72) Inventors: Sadamu Kajisa, Kyoto (JP); Kyouji Uemura, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 407 days.

(21) Appl. No.: 17/598,561

(22) PCT Filed: Mar. 27, 2020

(86) PCT No.: PCT/JP2020/014150
§ 371 (c)(1),
(2) Date: Sep. 27, 2021

(87) PCT Pub. No.: WO2020/203824
PCT Pub. Date: Oct. 8, 2020

(65) Prior Publication Data
US 2022/0148933 A1    May 12, 2022

(30) Foreign Application Priority Data

Mar. 29, 2019  (JP) ................................. 2019-065772

(51) Int. Cl.
*H01L 23/13*     (2006.01)
*H01L 23/00*     (2006.01)
(Continued)

(52) U.S. Cl.
CPC .......... *H01L 23/13* (2013.01); *H01L 23/3114* (2013.01); *H01L 23/49822* (2013.01);
(Continued)

(58) Field of Classification Search
CPC ......... H01L 23/49822; H01L 23/49861; H01L 23/053; H05K 3/4697
See application file for complete search history.

(56) References Cited

U.S. PATENT DOCUMENTS 5,920,117 A * 7/1999 Sono ................... H01L 23/3128
257/676
6,479,901 B1 * 11/2002 Yamada .................. H01L 24/32
257/737

(Continued)

FOREIGN PATENT DOCUMENTS

CN      103828038 A      5/2014
CN      109309059 A      2/2019
(Continued)

*Primary Examiner* — Jay C Chang
*Assistant Examiner* — Mikka Liu
(74) *Attorney, Agent, or Firm* — Volpe Koenig

(57) ABSTRACT

An electronic element mounting substrate according to an aspect of the present disclosure is provided with a substrate and a plurality of electrodes. The substrate includes an electronic element mounting region. The plurality of electrodes are located around the electronic element mounting region. The substrate includes the electronic element mounting region and at least one of a first protrusion portion spanning between the plurality of electrodes or a second protrusion portion spanning between the plurality of electrodes from an outer edge of the substrate in a plan view.

14 Claims, 12 Drawing Sheets

(51) Int. Cl.
*H01L 23/31* (2006.01)
*H01L 23/498* (2006.01)
*H05K 3/46* (2006.01)

(52) U.S. Cl.
CPC ........ *H01L 23/49861* (2013.01); *H01L 24/05* (2013.01); *H01L 24/48* (2013.01); *H05K 3/46* (2013.01); *H01L 2224/05552* (2013.01); *H01L 2224/48227* (2013.01)

(56) References Cited

U.S. PATENT DOCUMENTS

| | | | |
|---|---|---|---|
| 2009/0140405 A1* | 6/2009 | Maruo | H01L 23/10 |
| | | | 257/E23.18 |
| 2014/0177179 A1 | 6/2014 | Iiyama | |
| 2016/0128181 A1* | 5/2016 | Yamada | H05K 1/182 |
| | | | 174/262 |
| 2018/0254251 A1 | 9/2018 | Okamura et al. | |
| 2019/0035701 A1 | 1/2019 | Iwamoto | |

FOREIGN PATENT DOCUMENTS

| | | |
|---|---|---|
| JP | 08-046085 A | 2/1996 |
| JP | 08-186195 A | 7/1996 |
| JP | 2000-188351 A | 7/2000 |
| WO | 2017/086222 A1 | 5/2017 |

* cited by examiner

ELECTRONIC ELEMENT MOUNTING SUBSTRATE AND ELECTRONIC DEVICE

TECHNICAL FIELD

The present disclosure relates to an electronic element mounting substrate on which is mounted an electronic element, for example, an imaging element such as a charge coupled device (CCD) or a complementary metal oxide semiconductor (CMOS), a light emitting element such as a light emitting diode (LED), an element having a sensor function such as pressure, air pressure, acceleration, a gyroscope, or the like, and an integrated circuit; and an electronic device and electronic module.

BACKGROUND ART

There are known electronic element mounting substrates provided with a wiring board including an insulating layer. Furthermore, in some cases, insulating films or insulating layers are applied to the front and back surfaces of such electronic element mounting substrates. (See JP 2000-188351).

An electronic element mounting substrate is known that includes an electronic element mounting region on a surface of a base and includes a plurality of electrodes surrounding the element mounted in the electronic element mounting region. Furthermore, there is a need for a decrease in the height of electronic element mounting substrates and thinner electronic element mounting substrates have been developed.

However, with this thinning, the base is made thin, and a thin base leads to a decrease in the mechanical strength of the electronic element mounting substrate. Thus, the thickness of the base is partially increased at one or more portions by lamination or adhesion (see JP 2000-188351).

A laminating liquid or liquid adhesive is used to perform the lamination or adhesion to increase the thickness in one or more portions of the base. However, this may result in the liquid reaching the electrodes and causing a disconnection. Thus, there is a demand for an electronic element mounting substrate having excellent mechanical strength with a reduced likelihood of disconnection.

SUMMARY

An electronic element mounting substrate according to an aspect of the present disclosure is provided with a substrate and a plurality of electrodes. The substrate includes an electronic element mounting region. The plurality of electrodes are located around the electronic element mounting region. The substrate includes the electronic element mounting region and at least one of a first protrusion portion spanning between the plurality of electrodes or a second protrusion portion spanning between the plurality of electrodes from an outer edge of the substrate in a plan view.

DESCRIPTION OF EMBODIMENTS

Figure 1A:
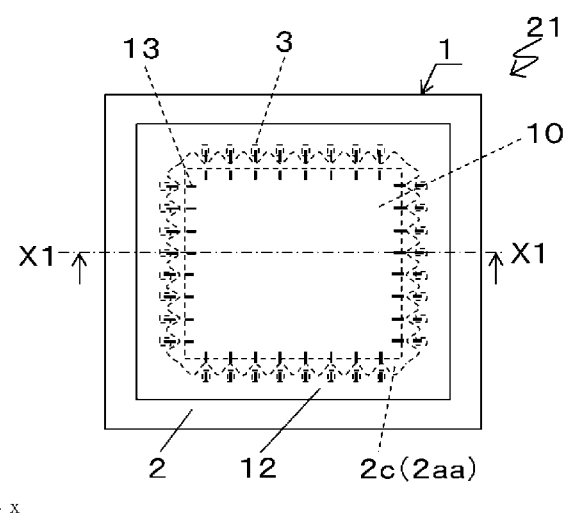
FIG. 1A is a top view illustrating the outer appearance of an electronic element mounting substrate and an electronic device according to a first embodiment of the present disclosure.

Configuration of Electronic Element Mounting Substrate and Electronic Device

Several exemplary embodiments of the present disclosure will be described hereinafter with reference to the drawings. In the following description, an electronic device is configured by mounting an electronic element on an electronic element mounting substrate. In addition, a configuration having a casing or a member provided on an upper surface side of the electronic element mounting substrate or surrounding the electronic device is defined as an electronic module. With respect to the electronic element mounting substrate, the electronic device, and the electronic module, any direction may be defined as upward or downward, but for the sake of simplicity, the Cartesian coordinate system XYZ will be used herein, with a positive side in the Z direction defined as upward.

An electronic element mounting substrate 1 according to an embodiment of the present disclosure includes a substrate 2a, a frame body 2b, and a plurality of electrodes 3 (hereinafter, also referred to as electrode pads 3). The substrate 2a includes an electronic element mounting region 4 (hereinafter, referred to as mounting region 4) where an electronic element is mounted. Furthermore, the plurality of electrodes 3 are positioned around the mounting region 4. The substrate 2a includes the mounting region 4 and includes at least one of a first protrusion portion 2aa spanning between the plurality of electrodes 3 or a second protrusion portion 2ab spanning between the plurality of electrodes 3 from the outer edge of the substrate 2a in plan view. That is, the substrate 2a may include only the first protrusion portion 2aa, only the second protrusion portion 2ab, or both the first protrusion portion 2aa and the second protrusion portion 2ab.

In a case where, for example, the section of the substrate 2a corresponding to the first protrusion portion 2aa and/or the second protrusion portion 2ab is made of a ceramic material, at least one more layer may be layered or a ceramic paste or the like may be layered. Alternatively, a separate body may be joined using a bonding member or the like. Also, in a case where, for example, the section of the substrate 2a corresponding to the first protrusion portion 2aa and/or the second protrusion portion 2ab is made of a resin material, processing may be performed to recess at least the region where the plurality of electrodes 3 are located. Alternatively, a separate body may be joined using a bonding member or the like. These may also be combined.

Embodiments of the present disclosure will be described below.

First Embodiment

An electronic device 21 and the electronic element mounting substrate 1 according to the first embodiment of the present disclosure will be described with reference to FIGS. 1 and 2.

The substrate 2a of the electronic element mounting substrate 1 includes a first substrate portion 2d and a second substrate portion 2e. The second substrate portion 2e is located on an upper surface 2da of the first substrate portion 2d. The second substrate portion 2e is located at a section corresponding to the first protrusion portion 2aa and/or the second protrusion portion 2ab. The second substrate portion 2e may include a plurality of insulating layers. For example, in a case where the substrate 2a includes at least the first protrusion portion 2aa, the second substrate portion 2e includes at least one (one layer of) insulating layer 2c including the mounting region 4 where an electronic element 10 is mounted on an upper surface. The substrate 2a includes the plurality of electrode pads 3 located on an upper surface of the substrate 2a and around the mounting region 4 in a top view. The first protrusion portion 2aa is located spanning between the plurality of electrodes 3. At this time, the first protrusion portion 2aa may not cover at least a portion of the plurality of electrodes 3. Thus, the plurality of electrode pads 3 include a portion exposed from above. Note that "spanning between the plurality of electrodes 3" means that the region extends to the plurality of electrodes 3 side more so than at least the mounting region 4.

Here, the mounting region 4 is a region on which at least one or more electronic elements 10 are mounted, and can be appropriately defined as, for example, the inside of the outermost periphery of the electrode pads 3, which will be described later, a region where a lid is mounted, and more. Further, a component mounted on the mounting region 4 is not limited to the electronic element 10, and may be, for example, an electronic component, and the number of electronic elements 10 and/or electronic components is not specified.

The second substrate portion 2e includes at least one of (one layer of) the insulating layer 2c. The insulating layer 2c may be the same material as the first substrate portion 2d or may be a different material. In a case where the insulating layer 2c is made of the same material as the first substrate portion 2d, it is possible to reduce the difference in thermal expansion between the insulating layer 2c and the first substrate portion 2d, and it is possible to reduce the occurrence of stress due to the difference in thermal expansion in the thermal history in the process of mounting the electronic element or when driving the electronic module. This allows for stabilized usage. In addition, in a case where the insulating layer 2c is a different material from the first substrate portion 2d, it is possible to reduce the deformation of the substrate 2a, particularly the first substrate portion 2d, when a base 2 is fabricated due to the difference in contraction with the insulating layer 2c of the different material or the like.

Figure 2A:
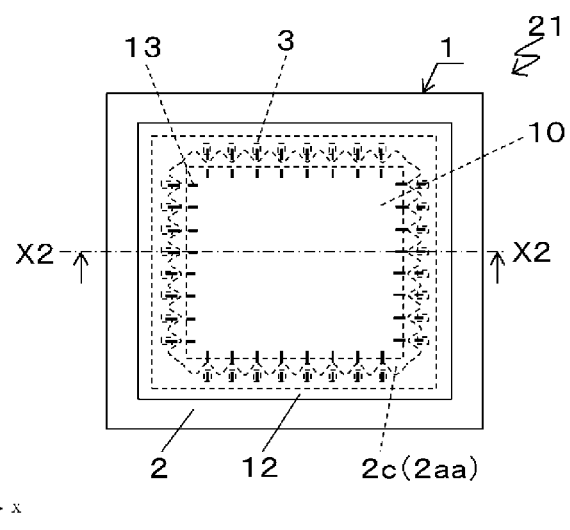
FIG. 2A is a top view illustrating an outer appearance of an electronic element mounting substrate and an electronic device according to another aspect of the first embodiment of the present disclosure and other embodiments.
Figure 2B:
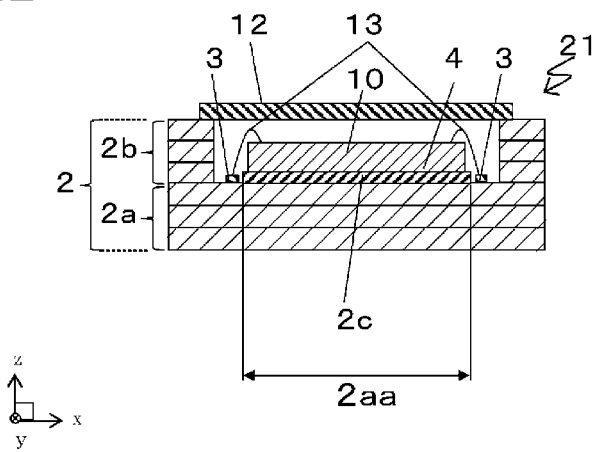
FIG. 2B is a vertical cross-sectional view taken along line X2-X2 in FIG. 2A.

As in the example illustrated in FIG. 2, the base 2 may include the substrate 2a and the frame body 2b. The frame body 2b may be the same material as the substrate 2a, or may be a different material. In a case where the frame body 2b is made of the same material as the substrate 2a, it is possible to reduce the difference in thermal expansion between the frame body 2b and the substrate 2a, and it is possible to reduce the occurrence of stress due to the difference in thermal expansion in the thermal history in the process of mounting the electronic element or when driving the electronic module. This allows for stabilized usage. In addition, in a case where the frame body 2b is a different material from the substrate 2a, deformation of the substrate 2a when fabricating the base 2 due to a difference in contraction with the frame body 2b of a different material or the like can be suppressed. Here, the frame body 2b may be integrally formed with the substrate 2a, or these may be separate bodies joined together. In a case where the frame body 2b is integrally formed with the substrate 2a, there is no join portion between the frame body 2b and the substrate 2a, and thus, the strength of the portion corresponding to the join portion is superior to that of the joint of the separate bodies. In addition, in a case where the frame body 2b is a separate body from the substrate 2a, the frame body 2b and the substrate 2a can be more easily fabricated than in a case where the frame body 2b and the substrate 2a are integrally formed, allowing for increased flexibility in design.

When the frame body 2b is provided as in the example illustrated in FIG. 2, it is possible to reduce the amount of scratching, adherence of foreign matter and the like to the surface of the electrode pads 3 caused by handling in the process of mounting the electronic element 10. In a case where the amount of scratching, adhesion of foreign matter, and the like on the electrode pads 3 is reduced, it is possible to reduce the inability to mount connecting members 13 and degradation of the strength of the connecting members 13.

Figure 1B:
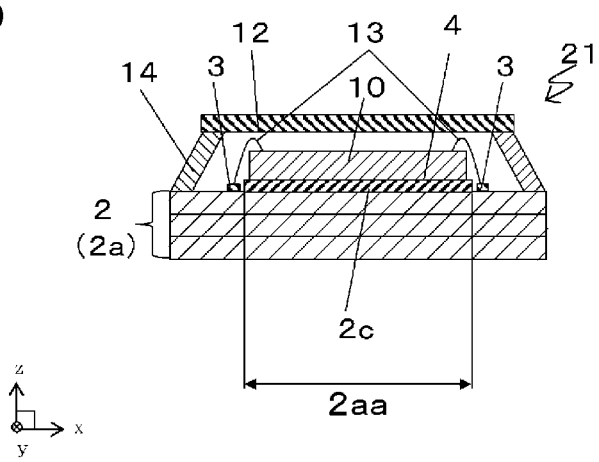
FIG. 1B is a vertical cross-sectional view taken along line X1-X1 in FIG. 1A.

In the example illustrated in FIGS. 1 and 2, the base 2 including the substrate 2a and the frame body 2b is formed by a plurality of insulating layers. Also, for example, the base 2 may have a configuration formed by a mold, a configuration formed by pressing using a metal mold, or a configuration with only one layer. Examples of the material of the insulating layers forming the base 2 include an electrically insulating ceramic and a resin.

Examples of the electrically insulating ceramic used as the material of the insulating layers forming the base 2 include an aluminum oxide-based sintered body, a mullite-based sintered body, a silicon carbide-based sintered body, an aluminum nitride-based sintered body, a silicon nitride-based sintered body, a glass ceramic sintered body, and the like. Examples of the resin used as the material of the insulating layers forming the base 2 include a thermoplastic resin, an epoxy resin, a polyimide resin, an acrylic resin, a phenol resin, a fluorine-based resin, and the like. Examples of the fluorine-based resin include an ethylene tetrafluoride resin.

As illustrated in FIG. 2, the base 2 may be formed of six insulating layers, or may be formed of five or less or seven or more insulating layers. When the number of insulating layers is five or less, the thickness of the electronic element mounting substrate 1 can be reduced. On the other hand, when the number of insulating layers is seven or more, the rigidity of the electronic element mounting substrate 1 can be increased.

For example, one side of an outermost periphery of the electronic element mounting substrate 1 may have a size of from 0.3 mm to 10 cm, and when the electronic element mounting substrate 1 has a quadrilateral shape in a top view, the shape may be square or rectangular. Further, for example, the thickness of the electronic element mounting substrate 1 may be 0.2 mm or more.

The substrate 2a includes the plurality of electrodes 3 (electrode pads 3) located on an upper surface of the substrate 2a and around the mounting region 4 in a top view. Here, the electrode pads 3 refer to pads that are electrically connected to the electronic element 10, for example.

Further, an external circuit connection electrode may be provided on the upper surface, the side surface, or the lower surface of the base 2 of the electronic element mounting substrate 1. The external circuit connection electrode may electrically connect the base 2 to an external circuit board or the electronic device 21 to an external circuit board.

Further, in addition to the electrode pads 3 and/or the external circuit connection electrode, electrodes formed between insulating layers, internal wiring electrical conductors, and through-hole conductors vertically connecting the internal wiring electrical conductors to each other may be provided on the upper surface or lower surface of the base 2. The electrodes, the internal wiring electrical conductors, or the through-hole conductors may be exposed on the surface of the base 2. The electrode pads 3 and/or the external circuit connection electrode may each be electrically connected by the electrodes, the internal wiring electrical conductors, or the through-hole conductors.

When the base 2 is made of an electrically insulating ceramic, the electrode pads 3, the external circuit connection electrode, the internal wiring electrical conductors, and/or the through-hole conductors contain tungsten (W), molybdenum (Mo), manganese (Mn), palladium (Pd), silver (Ag), or copper (Cu), or an alloy containing at least one metal material selected from these metals, or the like. Further, the electrode pads 3, the external circuit connection electrode, and/or the through-hole conductors may contain only copper (Cu). When the base body 2 is formed of a plurality of layers of resin, the electrode pads 3, the external circuit connection electrode, the internal wiring electrical conductors, and/or the through-hole conductors contain copper (Cu), gold (Au), aluminum (Al), nickel (Ni), molybdenum (Mo), palladium (Pd), or titanium (Ti), or an alloy containing at least one metal material selected from these metals, or the like.

A plating layer may be further provided on the exposed surfaces of the electrode pads 3, external circuit connection electrodes, internal wiring electrical conductors, and/or through-hole conductors. According to this configuration, oxidation can be suppressed by protecting the exposed surfaces of the external circuit connection electrode, the electrical conductor layer, and the through-hole conductors. In addition, according to this configuration, the electrode pads 3 and the electronic element 10 can be electrically connected favorably via the connection members 13 such as wires. The plating layer may be formed by depositing a nickel (Ni) plating layer having a thickness of from 0.5 μm to 10 μm, or by sequentially depositing the nickel plating layer and a gold (Au) plating layer having a thickness of from 0.5 μm to 3 μm.

However, with this recent thinning of various components such as smartphones, tablets, PCs, and the like, the base is made thin, and a thin base leads to a decrease in the mechanical strength of the electronic element mounting substrate. Thus, the thickness of the base is partially increased at one or more portions by laminating or bonding. A laminating liquid or liquid adhesive is used to perform the lamination or adhesion to increase the thickness in one or more portions of the base. However, this may result in the liquid reaching the electrodes and causing a disconnection. Thus, there is a demand for an electronic element mounting substrate having excellent mechanical strength with a reduced likelihood of disconnection. In the present disclosure, according to the configuration described above, because the protrusion portion, i.e., the thick portion of the substrate 2a is located spanning between the plurality of electrodes 3, the likelihood of disconnection of the plurality of electrodes 3 can be reduced while maintaining mechanical strength.

Additionally, at least a portion of the plurality of electrode pads 3 may be exposed from above. In other words, the surface of the substrate 2a is not all covered by the insulating layer 2c, and the portion where the electrode pads 3 are exposed is not covered by the insulating layer 2c. By providing the portion where the electrodes 3 are exposed, the laminating liquid or liquid adhesive used when printing or laminating is dispersed and soaked in the electronic element mounting substrate 1. By diffusing and soaking the laminating liquid or the liquid adhesive, the difference in concentration due to diffusion of the laminating liquid, liquid adhesive, or the like dispersed in the electronic element mounting substrate 1 can be reduced. In addition, the portion where the electrode pads 3 are exposed is provided with a portion not covered by the insulating layer 2c. Thus, the amount of the laminating liquid, liquid adhesive, or the like that diffuses into the electronic element mounting substrate can be reduced. This makes it possible to reduce the occurrence of defects such as cracking or disconnection caused by a reduction in the strength of the insulating layer.

As in the example illustrated in FIG. 1, the insulating layer 2c is located at the first protrusion portion 2aa, which is a section overlapping the mounting region 4 in a top view. An electronic element 10 or the like may be mounted in the mounting region 4, and an adhesive may be used in the process of mounting the electronic element 10. At this time, the surface of the insulating layer 2c can be made rougher than the surface of the base 2 not covered by the insulating layer 2c. By making the surface roughness of the insulating layer 2c rougher than the surface roughness of the base 2 not covered by the insulating layer 2c, the bonding strength between the adhesive and the insulating layer 2c can be improved via an anchoring effect.

As in the example illustrated in FIG. 1, the insulating layer 2c may be located at a position overlapping the mounting region 4 in a top view, and the outer edge of the insulating layer 2c is curved in a top view. That is, the outer edge of the first protrusion portion 2aa may include a curved portion. In a case where at least a portion of the outer edge portion of the insulating layer 2c includes a curved portion in a top view, it is possible to increase the boundary between the plurality of electrodes 3 and the portion to be laminated. Thus, occurrences of disconnection and the like of the plurality of electrodes 3 can be reduced while maintaining mechanical strength. In addition, by increasing the boundary portion where the strength difference of the insulating layer occurs, the occurrence of defects such as cracking in the electronic element mounting substrate 1 or disconnection of the internal wiring electrical conductor due to cracking can be reduced.

Furthermore, as in the example illustrated in FIGS. 1 and 2, an upper end of a portion of the outer edge portion of the insulating layer 2c can be located higher than the upper end of the plurality of electrode pads 3. In other words, the upper end of the first protrusion portion 2aa may be located higher than the upper end of the plurality of electrodes 3. The insulating layer 2c of the present embodiment includes the mounting region 4 where the electronic element 10 is mounted. The plurality of electrode pads 3 located around the mounting region 4 are provided. By providing the electrode pads 3 around the insulating layer 2c including the mounting region 4, it is possible to reduce the amount of scratching and adherence of foreign matter and the like to the surface of the electrode pads 3 caused by handling in the process of mounting the electronic element 10. In a case where the amount of scratching, adhesion of foreign matter, and the like on the electrode pads 3 is reduced, it is possible to reduce the inability to mount the connecting members 13 and degradation of the strength of the connecting members 13.

Configuration of Electronic Device

Examples of the electronic device 21 are illustrated in FIGS. 1 and 2. The electronic device 21 includes the electronic element mounting substrate 1 and the electronic element 10 mounted on the upper surface of the electronic element mounting substrate 1.

The electronic device 21 includes the electronic element mounting substrate 1 and the electronic element 10 mounted on the mounting region 4 of the substrate 2a of the electronic element mounting substrate 1. Examples of the electronic element 10 include, for example, an imaging element such as a charge coupled device (CCD) or a complementary metal oxide semiconductor (CMOS), a light emitting element such as a light emitting diode (LED), an element having a sensor function such as pressure, air pressure, acceleration, a gyroscope, or the like, and an integrated circuit. Note that the electronic element 10 may be disposed on the upper surface of the substrate 2a with an adhesive interposed therebetween. Examples of the adhesive include a silver epoxy and a thermosetting resin.

The electronic element 10 and the electronic element mounting substrate 1 may be electrically connected by, for example, the connecting members 13.

The electronic device 21 may include a lid 12 bonded to the upper surface of the electronic element mounting substrate 1 and covering the electronic element 10.

For example, when the electronic element 10 is an imaging element such as a CMOS or a CCD, or a light emitting element such as an LED, a material having high transparency such as a glass material may be used for the lid 12. Further, for example, when the electronic element 10 is an integrated circuit or the like, a metal material, a ceramic material, or an organic material may be used for the lid.

The lid 12 may be bonded to the electronic element mounting substrate 1 with a bonding member 14 interposed therebetween. Examples of materials for the bonding member 14 may include the thermosetting resin, a low melting point glass, and a brazing material made of a metal component.

Figure 3A:
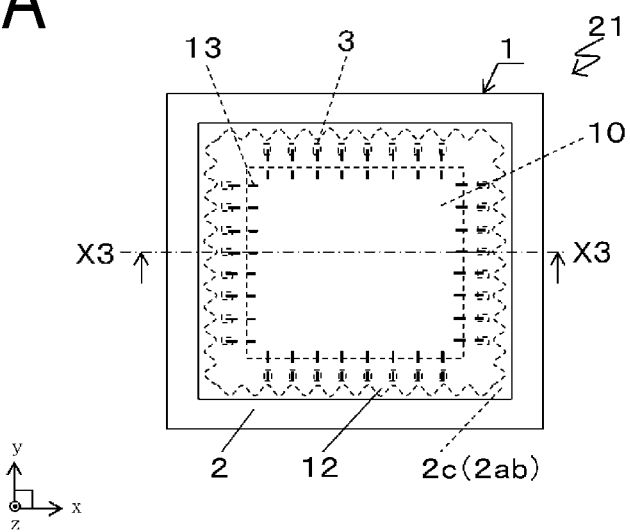
FIG. 3A is a top view illustrating the outer appearance of an electronic element mounting substrate and an electronic device according to a second embodiment of the present disclosure.
Figure 3B:
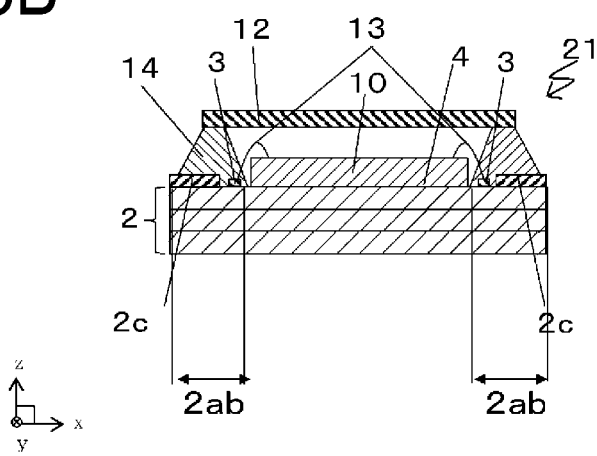
FIG. 3B is a vertical cross-sectional view taken along line X3-X3 in FIG. 3A.

In the case where the bonding member 14 is made of a material having insulating properties, such as the thermosetting resin or low melting point glass, and the bonding member 14 also covers the join portion of the electrode pads 3 and the connecting members 13 as in the example illustrated in FIG. 3, the join portion of the connecting members 13 and the electrode pads 3 can be reinforced. Accordingly, it is possible to improve the connection strength of the connecting members 13 and the electrode pads 3 (tensile strength to the upper surface of the connecting members 13).

In the case where the bonding member 14 is made of a material having electrical conductivity, such as a brazing material consisting of a metal component, if the lid 12 is made of a conductive material such as a metal, the electronic element 10 can be shielded from electromagnetic waves, thereby reducing malfunctions caused by electromagnetic waves.

Manufacturing Method of Electronic Element Mounting Substrate and Electronic Device Next, an example of a manufacturing method of the electronic element mounting substrate 1 and the electronic device 21 according to the present embodiment will be described. Note that as the example of the manufacturing method, a manufacturing method of the base 2 using a multipiece wiring board will be described below.

(1) First, ceramic green sheets that form the base 2 (the substrate 2a and the frame body 2b) are formed. For example, in order to obtain the base 2 made of an aluminum oxide ($Al_2O_3$) sintered compact, a powder of, for example, silica ($SiO_2$), magnesia ($MgO$), or calcia ($CaO$) is added as a sintering aid to $Al_2O_3$ powder. Further, a suitable binder, a solvent, and a plasticizer are added, and then a mixture thereof is kneaded to form a slurry. Then, multipiece ceramic green sheets are obtained by a formation method, such as a doctor blade method or a calender roll method.

Note that when the base 2 is made of a resin, for example, the base 2 can be formed by a transfer molding method, an injection molding method, pressing with a metal mold, or the like using a metal mold capable of forming the resin into a predetermined shape. Further, the material of the base 2 may be a base material made of glass fibers impregnated with resin, such as a glass epoxy resin. In this case, the base 2 can be formed by impregnating a base material made of glass fibers with an epoxy resin precursor and thermally curing the epoxy resin precursor at a predetermined temperature.

(2) Subsequently, the aforementioned green sheets are processed using a metal mold or the like. Here, an opening portion is formed in the frame body 2b. In addition, when the base 2 has a cutout section or the like, the cutout section or the like may be similarly formed at a predetermined portion of the green sheet to be the base 2.

(3) Subsequently, the ceramic green sheets to be respective insulating layers of the base 2 are layered and placed under pressure. In this way, the ceramic green sheets to be insulating layers may be layered to produce a ceramic green sheet laminated body to be the base 2 (the electronic element mounting substrate 1). Note that at this time, a portion to be the cutout section or the like may be appropriately produced by a metal mold or the like.

An insulating layer corresponding to the insulating layer 2c can be molded with a ceramic green sheet. Each of the insulating layers may be the same material as the base 2 or may be a different material.

(4) Subsequently, by a screen printing method or the like, a metal paste is applied to or filled in portions of the ceramic green sheets or the ceramic green sheet laminated body obtained in the above-described steps (1) to (3) that become the electrode pads 3, the external circuit connection electrode, the internal wiring electrical conductor, and the internal through-hole conductor. This metal paste is created so as to have appropriate viscosity by adding a suitable solvent and binder to the metal powder formed of the above-described metal materials, and kneading the mixture. Note that a glass or a ceramic may also be contained in the metal paste in order to increase the bonding strength with the base 2. Also, here, an insulating layer corresponding to the insulating layer 2c can be molded by screen printing. The insulating layer 2c may be the same material as the base 2 or may be a different material.

Further, when the base 2 is made of a resin, the electrode pads 3, the external circuit connection electrode, the internal wiring electrical conductors, and the through-hole conductors can be manufactured by sputtering, vaporizing, or the like. Furthermore, when the base body 2 is made of a resin, the electrode pads 3, the external circuit connection electrode, the internal wiring conductors, and the through-hole conductors may be manufactured by using a plating method after providing a metal film on the surface.

(5) Subsequently, split grooves may be provided at predetermined positions on the green sheet by using a metal mold, punching, a laser, or the like. Note that the split grooves can be formed by notching the multipiece wiring board shallower than the thickness thereof using a slicing device after firing. Alternatively, the split grooves may be formed by pressing a cutter blade against the ceramic green sheet laminated body for the multipiece wiring board, or by notching the ceramic green sheet laminated body shallower than the thickness thereof using a slicing device.

(6) Subsequently, the ceramic green sheet laminated body is fired at a temperature of from approximately 1500° C. to approximately 1800° C. to obtain the multipiece wiring board in which a plurality of the bases 2 (the electronic element mounting substrates 1) are arrayed. Note that, in this step, the above-described metal paste is fired at the same time as the ceramic green sheets forming the base 2 (the electronic element mounting substrate 1), and forms the electrode pads 3, the external circuit connection electrode, the internal wiring electrical conductor, and the through-hole conductor.

(7) Subsequently, the multipiece wiring board obtained by the firing is divided into a plurality of bases 2 (the electronic element mounting substrates 1). In this division, there is a method of dividing the multipiece wiring board into the plurality of the individual bases 2 by breaking along the split grooves that are formed on the multipiece wiring board along the portions becoming the outer edges of the bases 2 (the electronic element mounting substrates 1) in step (5). In addition, there is also a method of cutting along the portions becoming the outer edges of the bases 2 (the electronic element mounting substrates 1) by slicing or the like without performing step (5). Note that before or after dividing the multipiece wiring board into a plurality of bases 2 (electronic element mounting substrates 1), the plating may be applied to the electrode pads 3, the external connection pad, and exposed wiring conductors using an electrolytic or electroless plating method.

(8) Subsequently, the electronic element 10 is mounted on the electronic element mounting substrate 1. The electronic element 10 is electrically connected to the electronic element mounting substrate 1 with the connecting members 13. At this time, an adhesive or the like may be provided on the electronic element 10 or the electronic element mounting substrate 1 to fix the electronic element 10 to the electronic element mounting substrate 1. In addition, after the electronic element 10 is mounted on the electronic element mounting substrate 1, the lid 12 may be bonded to the electronic element mounting substrate 1 with the bonding member 14.

The electronic device 21 can be manufactured by manufacturing the electronic element mounting substrate 1 as described in steps (1) to (7) and mounting the electronic element 10 on the electronic element mounting substrate 1. Note that the order of the above-described steps (1) to (8) can be changed to another order in which the process can be performed. In addition to the process described above, the electronic element mounting substrate 1 can also be manufactured by using, for example, a 3D printer or the like.

Second Embodiment

The electronic device 21 and the electronic element mounting substrate 1 according to the second embodiment of the present disclosure will be described with reference to FIG. 3.

As in the first embodiment, the substrate 2a of the electronic element mounting substrate 1 may include the first substrate portion 2d and the second substrate portion 2e. The second substrate portion 2e is located on the upper surface 2da, which is an upper surface of the first substrate portion 2d. The second substrate portion 2e is located at a section corresponding to the first protrusion portion 2aa and/or the second protrusion portion 2ab. The second substrate portion 2e may include a plurality of insulating layers. The substrate 2a including the mounting region 4 includes the plurality of electrodes 3 (electrode pads 3) located on an upper surface of the substrate 2a and around the mounting region 4 in a top view. In this example, the substrate 2a includes at least the second protrusion portion 2ab. The substrate 2a includes the second protrusion portion 2ab located spanning between the plurality of electrode pads 3 from the outer edge of the substrate 2a, and the second protrusion portion 2ab includes, for example, at least one of (one layer of) the insulating layer 2c corresponding to the second substrate portion 2e.

In this embodiment, the structure of the electronic device 21, the substrate 2a, the electrode pads 3, the insulating layer 2c, the electronic element 10, and the like constituting the electronic element mounting substrate 1, and the base materials, conditions, and configuration of the substrate 2a are similar to those of the first embodiment, and thus descriptions thereof will be omitted.

The substrate 2a includes at least one of (one layer of) the insulating layer 2c on the second protrusion portion 2ab. In other words, the insulating layer 2c surrounds the outer periphery of the plurality of electrode pads 3. At least a portion of the plurality of electrode pads 3 is exposed from above. In other words, the surface of the substrate 2a is not all covered by the insulating layer 2c, and the portion where the electrode pads 3 are exposed is not covered by the insulating layer 2c. In this example, the upper end of the second protrusion portion 2ab is located higher than the upper end of the plurality of electrodes 3.

In the present disclosure, according to the configuration described above, in addition to the protrusion portion, i.e., the thick portion of the substrate 2a located spanning between the plurality of electrodes 3, the upper end of the protrusion portion is located higher than the electrodes 3, thereby further improving the mechanical strength.

Specifically, as in the first embodiment, the electrode pads 3 are exposed, the surface of the substrate 2a is not all covered by the insulating layer 2c, and the portion where the electrode pads 3 are exposed is not covered by the insulating layer 2c. In other words, by providing the portion not covered by the insulating layer 2c, the laminating liquid or liquid adhesive used when laminating is dispersed and soaked in the electronic element mounting substrate 1. By diffusing and soaking the laminating liquid or the liquid adhesive, the difference in concentration due to diffusion of the laminating liquid, liquid adhesive or the like dispersed in the electronic element mounting substrate 1 can be reduced. In addition, the portion where the electrode pads 3 are exposed, i.e., the portion not covered by the insulating layer 2c, is provided. Thus, the amount of the laminating liquid, liquid adhesive, or the like that diffuses into the electronic element mounting substrate 1 can be reduced. This makes it possible to reduce the occurrence of defects such as cracking or disconnection caused by a reduction in the strength of the insulating layer.

Furthermore, in the example illustrated in FIG. 3, the insulating layer 2c is located below the bonding member 14 for bonding the lid 12 to the base 2. At this time, the surface of the insulating layer 2c can be made rougher than the surface of the base 2 not covered by the insulating layer 2c. By making the surface roughness of the insulating layer 2c rougher than the surface roughness of the base 2 not covered by the insulating layer 2c, the bonding strength of the bonding member 14 to the base 2 can be improved via an anchoring effect. In addition, because the lid 12 and the bonding member 14 are located on the outer periphery of the electronic device 21, stress from the outside of the electronic device 21 may be directly applied during handling. In contrast, in the present embodiment, it is possible to improve the bonding strength of the bonding member 14 to the base 2 with respect to stress from the outside.

When the bonding member 14 also covers the join portion of the electrode pads 3 and the connecting members 13 as in the example illustrated in FIG. 3, the join portion of the connecting members 13 and the electrode pads 3 can be reinforced. Accordingly, it is possible to improve the connection strength of the connecting members 13 and the electrode pads 3 (tensile strength to the upper surface of the connecting members 13).

Third Embodiment

Figure 4A:
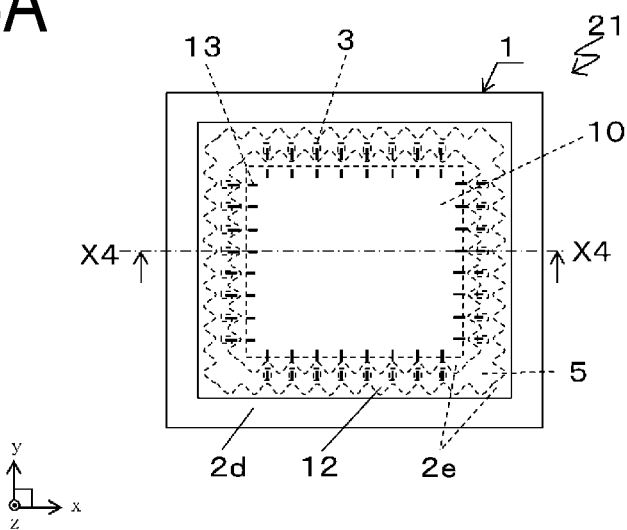
FIG. 4A is a top view illustrating the outer appearance of an electronic element mounting substrate and an electronic device according to a third embodiment of the present disclosure.
Figure 4B:
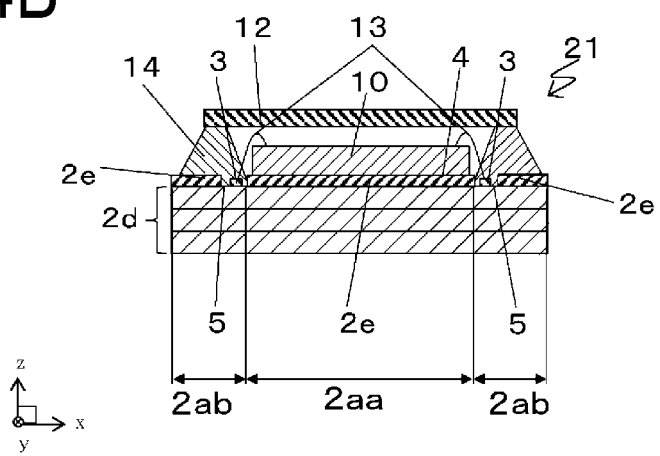
FIG. 4B is a vertical cross-sectional view taken along line X4-X4 in FIG. 4A.
Figure 5A:
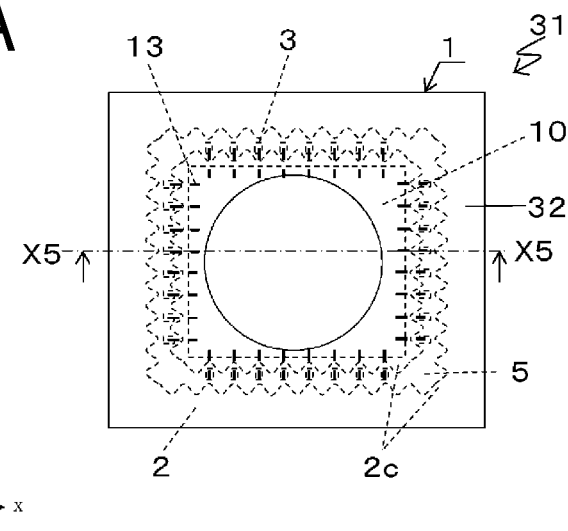
FIG. 5A is a top view illustrating the outer appearance of an electronic module according to another aspect of the third embodiment of the present disclosure.
Figure 5B:
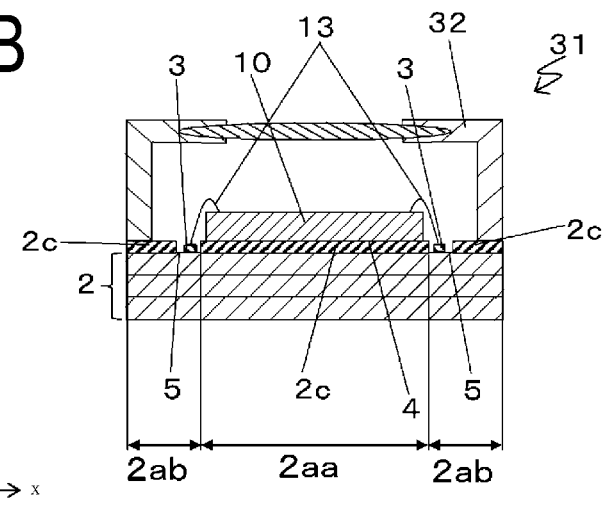
FIG. 5B is a vertical cross-sectional view taken along line X5-X5 in FIG. 5A.

The electronic device 21, an electronic module 31, and the electronic element mounting substrate 1 according to the third embodiment of the present disclosure will be described with reference to FIGS. 4 and 5. Note that in the present embodiment, FIG. 4 illustrates the electronic device 21. FIG. 5 illustrates the electronic device 21 with a casing 32 (lens) mounted instead of the lid 12.

The electronic element mounting substrate 1 includes the substrate 2a and at least one insulating layer 2c located on an upper surface of the substrate 2a and including the mounting region 4 where the electronic element 10 is mounted on the upper surface. The insulating layer 2c includes an opening portion 5, and the plurality of electrode pads 3 are located in the opening portion 5.

In this embodiment, the structure of the electronic device 21, the substrate 2a, the electrode pads 3, the insulating layer 2c, the electronic element 10, and the like constituting the electronic element mounting substrate 1, and the base materials, conditions, and configuration of the substrate 2a are similar to those of the first embodiment, and thus descriptions thereof will be omitted.

The electronic element mounting substrate 1 has a substrate 2a having, on the upper surface, a mounting region 4 where the electronic element 10 is mounted, and at least one insulating layer 2c located on the upper surface of the substrate 2a.

Here, the mounting region 4 is a region on which at least one or more electronic elements 10 are mounted, and can be appropriately defined as, for example, the inside of the outermost periphery of an electrode pads 3, which will be described later, a region where a lid is mounted, and more. Further, a component mounted on the mounting region 4 is not limited to the electronic element 10, and may be, for example, an electronic component, and the number of electronic elements 10 and/or electronic components is not specified.

The substrate 2a may include at least one insulating layer 2c on the first protrusion portion 2aa and/or the second protrusion portion 2ab. The insulating layer 2c may be the same material as the substrate 2a or may be a different material. In a case where the insulating layer 2c is made of the same material as the substrate 2a, it is possible to reduce the difference in thermal expansion between the insulating layer 2c and the substrate 2a, and it is possible to reduce the occurrence of stress due to the difference in thermal expansion in the thermal history in the process of mounting the electronic element or when driving the electronic module. This allows for stabilized usage. In addition, in a case where the insulating layer 2c is a different material from the substrate 2a, deformation of the substrate 2a when forming the base 2 caused by a difference in contraction with the insulating layer 2c of a different material or the like can be suppressed.

As in the example illustrated in FIGS. 4 and 5, the first protrusion portion 2aa and the second protrusion portion 2ab are connected, and the plurality of electrodes 3 may be surrounded by the first protrusion portion 2aa and the second protrusion portion 2ab. In other words, the insulating layer 2c includes the opening portion 5, and the plurality of electrode pads 3 are located in the opening portion 5. In other words, the surface of the substrate 2a is not completely covered by the insulating layer 2c, and the portion where the electrode pads 3 are exposed is not covered by the insulating layer 2c. Also, in a case where the substrate 2a includes the first substrate portion 2d and the second substrate portion 2e, a portion of the second substrate portion 2e includes the opening portion 5, and the electrodes may be exposed from the opening portion 5.

In other words, by providing the portion not covered by the insulating layer 2c, the laminating liquid or liquid adhesive used when printing or laminating is dispersed and soaked in the electronic element mounting substrate 1. By diffusing and soaking the laminating liquid or the liquid adhesive, the difference in concentration due to diffusion of the laminating liquid, liquid adhesive or the like dispersed in the electronic element mounting substrate 1 can be reduced. In addition, by providing the portion where the electrode pads 3 are exposed, i.e., the portion not covered by the first insulating layer, the amount of the laminating liquid, liquid adhesive, or the like that diffuses into the electronic element mounting substrate 1 can be reduced. This makes it possible to reduce the occurrence of defects such as cracking or disconnection caused by a reduction in the strength of the insulating layer.

In the present embodiment, the insulating layer 2c includes the opening portion 5, and the plurality of electrode pads 3 are located in the opening portion 5. In other words, the plurality of electrode pads 3 are surrounded by the insulating layer 2c. This makes it further possible to effectively reduce the amount of scratching, adherence of foreign matter, and the like to the surface of the electrode pads 3 caused by handling in the process of mounting the electronic element 10 and lid 12. In a case where the amount of scratching, adhesion of foreign matter, and the like on the electrode pads 3 is reduced, it is possible to reduce the inability to mount the connecting members 13 and degradation of the strength of the connecting members 13.

As in the example illustrated in FIG. 4, the insulating layer 2c is located overlapping the mounting region 4 in a top view. In other words, the insulating layer 2c is located at a position corresponding to the first protrusion portion 2aa. Furthermore, the insulating layer 2c is located below the bonding member 14 for bonding the lid 12 to the base 2.

The surface of the insulating layer 2c can be made rougher than the surface of the base 2 not covered by the insulating layer 2c. Examples of methods for roughening the surface of the insulating layer 2c include the following methods. For example, in a case where the substrate 2a is made of a ceramic material, the amount of the binder, solvent, and plasticizer added to the substrate 2a when the insulating layer 2c is fabricated can be varied, the evaporation amount of the binder when firing can be managed, or the like to increase the surface roughness. Also, the insulating layer 2c with a rough surface can be fabricated by pressing the surface of the substrate 2a against a surface of a sheet of Japanese paper or the like that is rougher than the surface of the substrate 2a. By roughening the surface of the insulating layer 2c, both the effect of the first embodiment and the effect of the second embodiment can be obtained. In other words, when the bonding strength of the adhesive used when mounting the electronic element 10 is improved, the bonding strength of the bonding member 14 for bonding the lid 12 to the base2 is improved, and the bonding member 14 also covers the join portion of the electrode pads 3 and the connecting members 13, the bonding strength between the connecting members 13 and the electrode pads 3 can be reinforced.

In addition, in a case where the insulating layer 2c is formed by the screen printing method described below, the outer edge portion of the insulating layer 2c rises in the z direction as compared with a portion inside the outer edge portion. This rise can reduce the flow to the electrode pads 3 of the adhesive used to mount the electronic element 10. In a case where the flow to the electrode pads 3 of the adhesive used to mount the electronic element 10 is reduced, it is possible to reduce the adherence of foreign matter and the like. In a case where adhesion of foreign matter and the like is reduced, it is possible to reduce the inability to mount the connecting members 13, and degradation of the strength of the connecting members 13.

In the example illustrated in FIG. 5, the electronic module 31 with the casing 32 (lens) mounted instead of the lid 12 is illustrated. In a case where a bonding member is used to bond the casing 32 and the base 2, by roughening the surface of the insulating layer 2c, the bonding strength of the bonding member can be improved via an anchoring effect in order to bond the casing 32 and the base 2. In addition, because the casing 32 is located outside of the electronic device 21, stress from the outside of the electronic device 21 may be directly applied during handling. It is possible to improve the bonding strength with respect to such stress from the outside.

Configuration of Electronic Module

FIG. 5 illustrates an example of the electronic module 31 utilizing the electronic element mounting substrate 1. The electronic module 31 includes the electronic device 21 and the casing 32 provided covering the upper surface of the electronic device 21 or the electronic device 21. Note that, in the examples described below, an imaging module is described as an example.

The electronic module 31 may include the casing 32 (a lens holder). The inclusion of the casing 32 makes it possible to further improve airtightness or reduce the direct application of stress from the outside to the electronic device 21. The casing 32 is made of, for example, a resin or a metal material. When the casing 32 is a lens holder, one or more lenses made of a resin, a liquid, a glass, a crystal, or the like may be incorporated into the casing 32. In addition, the casing 32 may be equipped with a drive device or the like configured to drive up, down, left, and right, and may be electrically connected to a pad or the like located on the surface of the electronic element mounting substrate 1 by using a bonding member such as solder.

Note that the casing 32, in a top view, may be provided with an opening portion on at least one side in any of four directions. Further, an external circuit board may be inserted through the opening portion of the casing 32 and electrically connected to the electronic element mounting substrate 1. In addition, after the external circuit board has been electrically connected to the electronic element mounting substrate 1, the opening portion of the casing 32 may be sealed with a sealing material such as a resin or the like, such that the inside of the electronic module 31 may be hermetically sealed.

The electronic module 31 may be directly bonded to the electronic element mounting substrate 1 as illustrated in FIG. 5. In this case, the lid 12 and the bonding member 14 used as a member of the electronic device 21 are not used. Thus, by not using the two members, the lid 12 and the bonding member 14, it is possible to reduce the weight and size of the electronic module. Furthermore, not using the lid 12 and the bonding member 14 in the electronic element mounting substrate 1 means that there is no process to bond these. Thus, the thermal loading process when fabricating the electronic module can be reduced. Accordingly, it is possible to reduce the occurrence of defects or the like caused by the difference in thermal expansion of each member due to this thermal loading process.

Fourth Embodiment

Figure 6A:
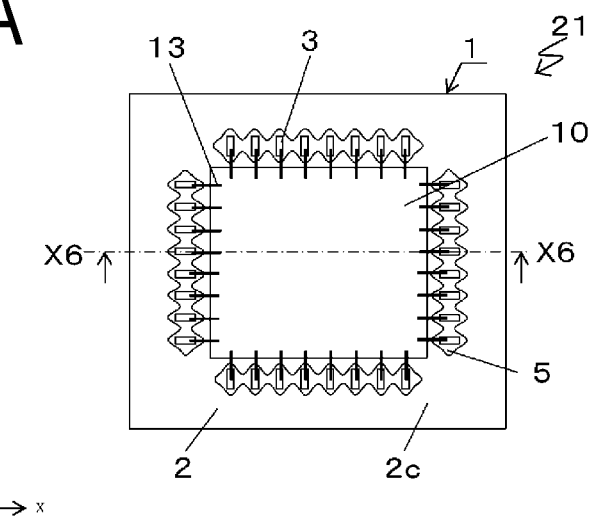
FIG. 6A is a top view illustrating the outer appearance, minus a lid, of an electronic element mounting substrate and an electronic device according to the fourth embodiment of the present disclosure.
Figure 6B:
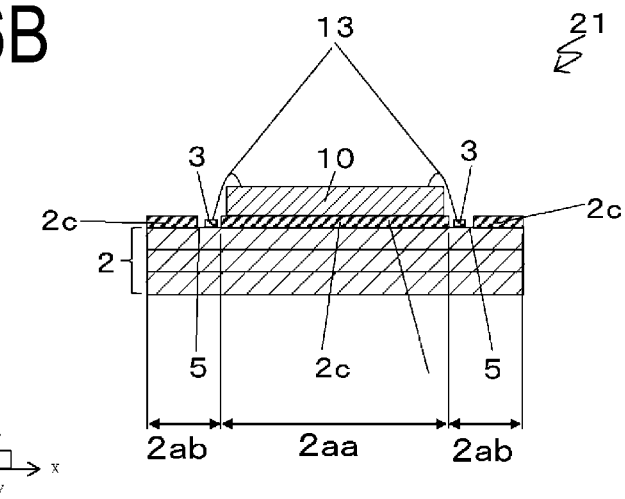
FIG. 6B is a vertical cross-sectional view taken along line X6-X6 in FIG. 6A.
Figure 7A:
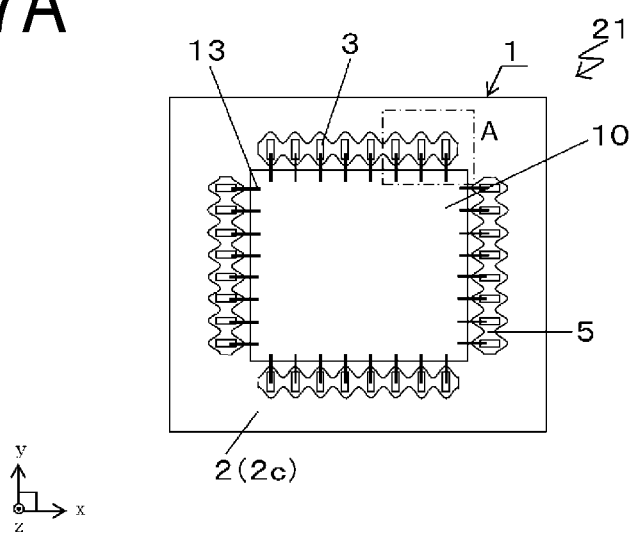
FIG. 7A is a top view illustrating the outer appearance, minus a lid, of an electronic element mounting substrate and an electronic device according to another aspect of the fourth embodiment of the present disclosure.
Figure 7B:
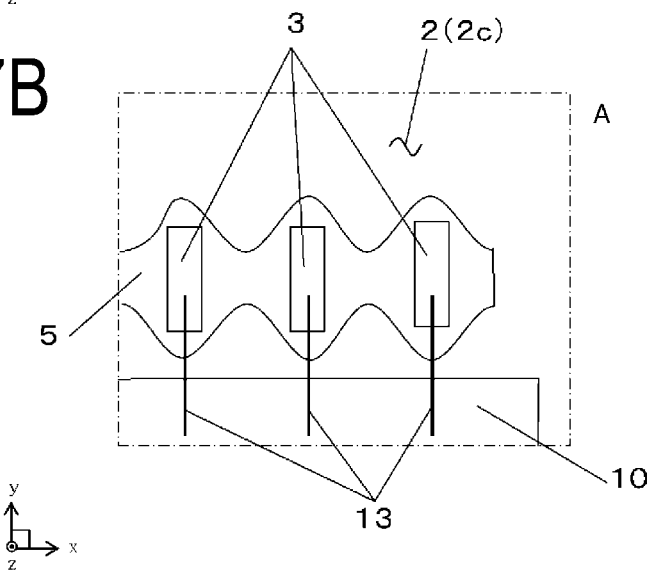
FIG. 7B is an enlarged view of a main portion A of the electronic element mounting substrate in FIG. 7A.

The electronic element mounting substrate 1 according to a fourth embodiment of the present disclosure will be described next with reference to FIGS. 6 to 11. Note that in the present embodiment, the electronic device 21 illustrated in the example illustrated in FIGS. 6 and 7 is without the lid 12 and the bonding member 14. FIGS. 8 to 11 illustrate an enlarged view of a main portion A of the embodiment illustrated in FIG. 7, and illustrate another example of the opening portion 5 of the insulating layer 2c.

In the example illustrated in FIG. 6, the insulating layer 2c includes the opening portion 5, and the plurality of electrode pads 3 are located in the opening portion 5. The difference from the third embodiment is that the shape of the opening portion 5 in the insulating layer 2c is different.

Also, in the present embodiment, by providing the portion not covered by the insulating layer 2c on the surface of the substrate 2a, the laminating liquid or liquid adhesive used when printing or laminating is dispersed and soaked in the electronic element mounting substrate 1 while maintaining mechanical strength. By diffusing and soaking the laminating liquid or the liquid adhesive in the electronic element mounting substrate 1 used when printing or laminating, the difference in concentration due to diffusion of the laminating liquid, liquid adhesive or the like dispersed in the electronic element mounting substrate 1 can be reduced. In addition, by providing the portion where the electrode pads 3 are exposed, i.e., the portion not covered by the first insulating layer, the amount of the laminating liquid, liquid adhesive, or the like that diffuses into the electronic element mounting substrate can be reduced. This makes it possible to reduce the occurrence of defects such as cracking or disconnection caused by a reduction in the strength of the insulating layer.

In the example illustrated in FIG. 6, the opening portion 5 of the insulating layer 2c is provided in a small size. By the opening portion 5 of the insulating layer 2c being small, this makes it further possible to effectively reduce the amount of scratching, adherence of foreign matter, and the like to the surface of the electrode pads 3 caused by handling when mounting the electronic element 10 and lid 12. In a case where the amount of scratching, adhesion of foreign matter, and the like on the electrode pads 3 is reduced, it is possible to reduce the inability to mount the connecting members 13 and degradation of the strength of the connecting members 13.

The difference between the embodiment illustrated in FIG. 7 and the embodiment illustrated in FIG. 6 is that the shape of the opening portion 5 in the insulating layer 2c is different. In the example illustrated in FIG. 7, the end of the opening portion 5 of the insulating layer 2c is linear in accordance with the linear portion of the electrode pads 3. Because the insulating layer 2c is linear as in the embodiment in FIG. 7, the insulating layer 2c is located at a position closer to the electrode pads 3. This makes it further possible to effectively reduce the amount of scratching, adherence of foreign matter, and the like to the surface of the electrode pads 3 caused by handling when mounting the electronic element 10 and the lid 12. In a case where the amount of scratching, adhesion of foreign matter, and the like on the electrode pads 3 is reduced, it is possible to reduce the inability to mount the connecting members 13 and degradation of the strength of the connecting members 13.

Figure 8A:
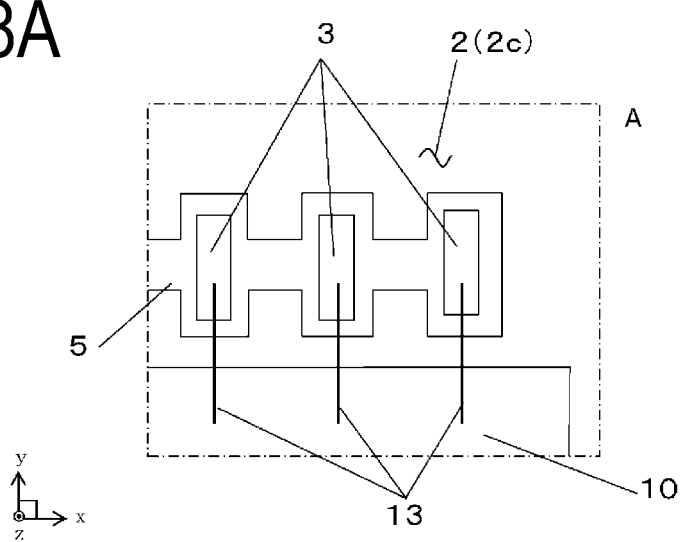
FIGS. 8A and 8B are diagrams of an enlarged main portion A of a variation of the electronic element mounting substrate illustrated in FIG. 7A.

The difference between the embodiment illustrated in FIG. 8 and the embodiment illustrated in FIG. 7 is that the number of linear portions of the opening portion 5 of the insulating layer 2c is increased. In FIG. 8A, the shape of the opening portion 5 of the insulating layer 2c is also linear in accordance with the shape of the linear portion of each of the plurality of electrode pads 3. The insulating layer 2c illustrated in FIG. 8A does not include a curved portion, but the entire insulating layer 2c has a winding shape in a top view. In other words, the insulating layer 2c having a winding shape allows the laminating liquid or the like used when printing or laminating to disperse and soak in the electronic element mounting substrate. This dispersion and soaking makes it possible to reduce the occurrence of defects such as cracking or disconnection caused by a reduction in the strength of the insulating layer.

In the example illustrated in FIG. 8, also the shape of the opening portion 5 of the insulating layer 2c is linear in accordance with the shape of the linear portion of each of the plurality of electrode pads 3. The clearance between the linear portion of the electrode pads 3 and the linear portion of the insulating layer 2c can be secured to the same extent in the up-and-down and left-and-right directions of the electrode pads 3. The clearance of the electrode pads 3 and the insulating layer 2c can be secured to the same extent in the up-and-down and left-and-right directions of the electrode pads 3. Thus, any offset in the manufacturing process between the electrode pads 3 and the insulating layer 2c can be easily detected. By easily detecting the offset in the manufacturing process, it is possible to correct the offset during manufacturing, leading to improvement in the manufacturing process. Furthermore, by managing the offset in the manufacturing process, the mounting area of the connecting members 13 can be maintained. In other words, by maintaining the mounting area of the connecting members 13, it is possible to improve the mountability of the connecting members 13.

Figure 8B:
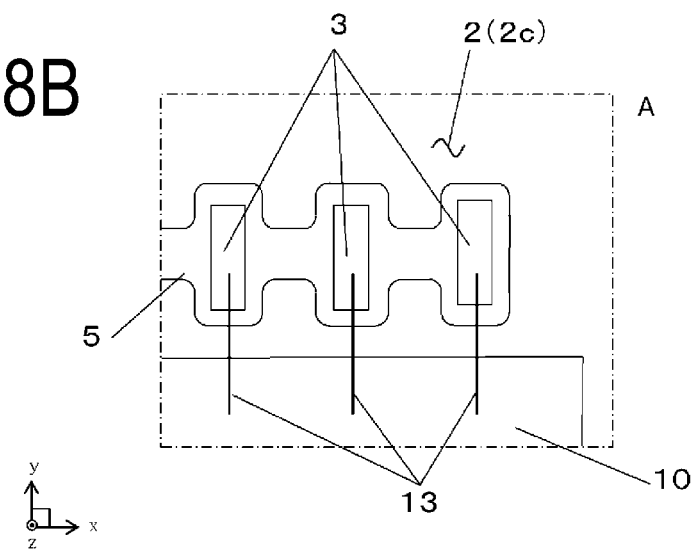

The opening portion 5 of the insulating layer 2c according to the embodiment illustrated in FIG. 8B includes a curved portion in a top view. In other words, the outer edge of the first protrusion portion 2aa and/or the inner edge of the second protrusion portion 2ab includes a curved portion in a top view. Due to the curved portion, stress concentration when pressure is applied to the insulating layer 2cd can be alleviated. Additionally, in a case where a curved portion is included, stress can be dispersed when stress is applied to the insulating layer 2c in the mounting process or the like, thereby reducing the occurrence of defects such as cracking and disconnection. Here, in a case where the substrate 2a includes the first protrusion portion 2aa and the second protrusion portion 2ab, the outer edge of the first protrusion portion 2aa and the inner edge of the second protrusion portion 2ab may have a similar shape.

Figure 9A:
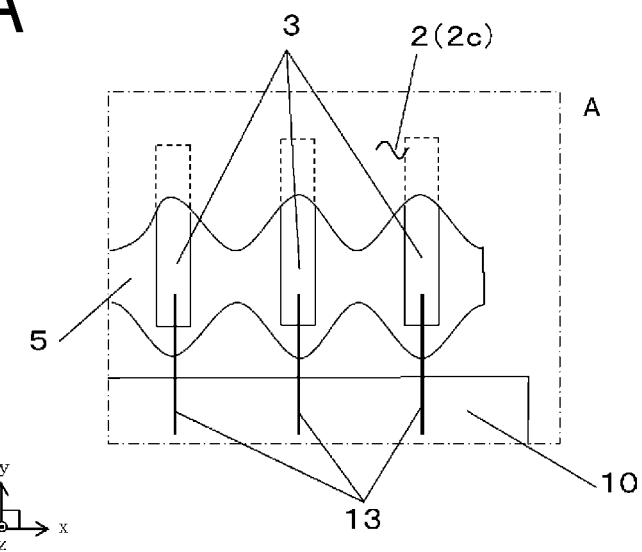
FIGS. 9A and 9B are diagrams of an enlarged main portion A of a variation of the electronic element mounting substrate illustrated in FIG. 7A.
Figure 9B:
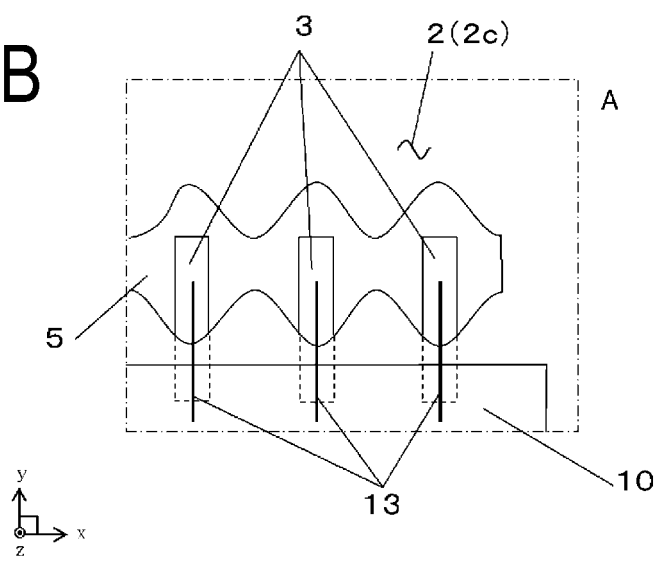
Figure 10:
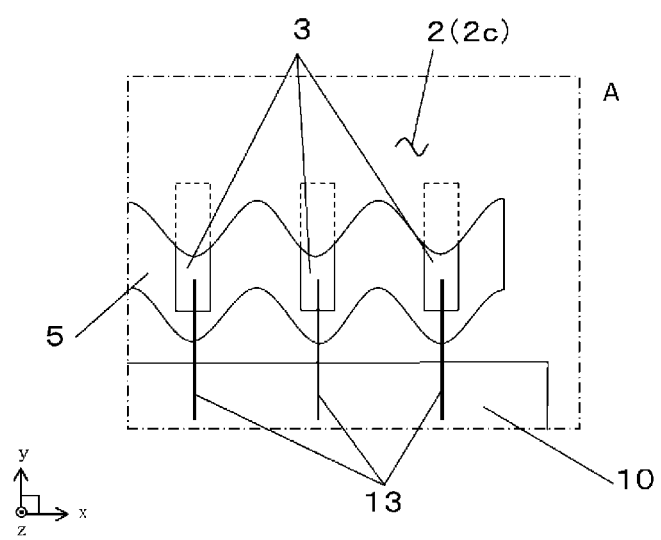
FIG. 10 is a diagram of an enlarged main portion A of the electronic element mounting substrate illustrated in FIG. 7A.

The insulating layer 2c of the embodiment illustrated in FIGS. 9 to 11 covers a portion of the plurality of electrode pads 3. With the insulating layer 2c covering the plurality of electrode pads 3, the upper end of the insulating layer 2c is located higher than the upper end of the plurality of electrode pads 3 in a cross-sectional view. When the insulating layer 2c is located higher than the electrode pads 3 in a cross-sectional view, it is possible to reduce the likelihood of the jig used in the process for mounting the electronic element 10 and the lid 12 coming into contact with the surface of the electrode pads 3. In a case where contact of the jig with the surface of the electrode pads 3 is reduced, it is possible to reduce scratching. In a case where the amount of scratching on the electrode pads 3 is reduced, it is possible to reduce the inability to mount the connecting members 13, and degradation of the strength of the connecting members 13. In addition, by the insulating layer 2c covering the plurality of electrode pads 3, the area where the electrode pads 3 are exposed can be reduced, and the amount of gold plating applied to the surface of the electrode pads 3 can be reduced. Reducing the amount of gold plating used may help keep the cost of the electronic element mounting substrate 1 to a minimum. In a case where the exposure of the electrode pads 3 to the surface of the electronic element mounting substrate 1 is reduced, the metal portion present on the surface can be reduced. This makes it possible to reduce surface deterioration of the electrode pads 3.

In the embodiment illustrated in FIGS. 9 and 10, the exposed portions of the plurality of electrode pads 3 have a wave-like shape. In this example, the outer edge of the first protrusion portion 2aa and/or the inner edge of the second protrusion portion 2ab may have a wave-like shape in a top view. The shape of the outer edge of the opening portion 5 of the insulating layer 2c of the embodiment illustrated in FIG. 9 is a wave shape. In addition, in FIG. 9, the shape of the opening portion 5 of the insulating layer 2c is such that the electrode pads 3 are made wider. Even with such a shape, the same effects as described above can be obtained. In addition, because the electrode pads 3 are larger, the area where the connecting members 13 are mounted on the electrode pads 3 can be increased. By increasing the area where the connecting members 13 are mounted on the electrode pads 3, the mountability of the connecting members 13 can be improved.

The embodiment illustrated in FIG. 9A and the embodiment illustrated in FIG. 9B differ in that the extending direction of the electrode pads 3 (the unexposed portion of the electrode pads 3) is a direction toward the electronic element 10 mounted on the electronic element mounting substrate 1 or the opposite direction. In the embodiment illustrated in FIG. 9B, the extending direction of the electrode pads 3 (the unexposed portion of the electrode pads 3) is a direction toward the electronic element 10 mounted on the electronic element mounting substrate 1. Because the extending direction of the electrode pads 3 is a direction toward the electronic element 10, the size of the electronic element mounting substrate 1 can be reduced, which makes it possible to reduce the size of the electronic device 21. In the embodiment illustrated in FIG. 9A, the extending direction of the electrode pads 3 (the unexposed portion of the electrode pads 3) is a direction opposite the direction toward the electronic element 10 mounted on the electronic element mounting substrate 1. There is a tendency for the number of terminals to increase due to the increasing speed and number of functions of the electronic element 10. By the extending direction of the electrode pads 3 (the unexposed portion of the electrode pads 3) being a direction opposite the direction toward the electronic element 10 mounted on the electronic element mounting substrate 1, an increase in the number of terminals of the electronic element 10 can be handled. In other words, it is possible to increase the speed and number of functions of the electronic device. In addition, by orienting the extending direction of the electrode pads 3 (the unexposed portion of the electrode pads 3) toward the electronic element 10 mounted on the electronic element mounting substrate 1 and in the opposite direction, it is possible to make the electronic device smaller and meet the demand for high speed and more functions.

The embodiment illustrated in FIG. 10 and the embodiment illustrated in FIG. 9 are different in terms of the shape of the opening portion 5 of the insulating layer 2c. In the embodiment illustrated in FIG. 10, the size of the opening portion 5 of the insulating layer 2c in the y direction is constant. The laminating liquid, liquid adhesive, or the like used when printing or laminating the insulating layer 2c is dispersed and soaked in the electronic element mounting substrate. Because the size of the opening portion 5 of the insulating layer 2c in the y direction is constant for dispersing and soaking, the difference in concentration due to diffusion of the laminating liquid, the liquid adhesive, or the like dispersed in the electronic element mounting substrate 1 can be reduced. This makes it possible to reduce the occurrence of defects such as cracking or disconnection caused by a reduction in the strength of the insulating layer. Also, by the opening portion 5 of the insulating layer 2c being made small, this makes it further possible to effectively reduce the amount of scratching, adherence of foreign matter, and the like to the surface of the electrode pads 3 caused by handling when mounting the electronic element 10 and lid 12. In a case where the amount of scratching, adhesion of foreign matter, and the like on the electrode pads 3 is reduced, it is possible to reduce the inability to mount the connecting members 13 and degradation of the strength of the connecting members 13.

The embodiment illustrated in FIG. 11 and the embodiment illustrated in FIG. 10 are different in terms of the shape of the opening portion 5 of the insulating layer 2c. In the embodiment illustrated in FIG. 11, a portion of the shape of the opening portion 5 of the insulating layer 2c is linear. In other words, the exposed portion of the electrode pads 3 is linear in this linear portion. By making the exposed portion of the electrode pads 3 linear, it is possible to narrow the opening portion 5 of the insulating layer 2c while maintaining the mounting area of the connecting members 13. This makes it further possible to effectively reduce the amount of scratching, adherence of foreign matter, and the like to the surface of the electrode pads 3 caused by handling when mounting the electronic element 10 and lid 12. In a case where the amount of scratching, adhesion of foreign matter, and the like on the electrode pads 3 is reduced, it is possible to reduce the inability to mount the connecting members 13 and degradation of the strength of the connecting members 13.

Figure 11A:
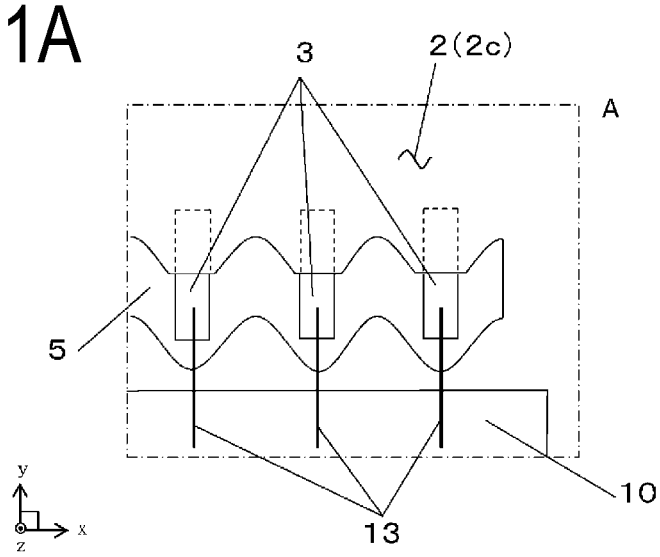
FIGS. 11A and 11B are diagrams of an enlarged main portion A of a variation of the electronic element mounting substrate illustrated in FIG. 7A.

In the embodiment illustrated in FIG. 11A, the size of the opening 5 portion of the insulating layer 2c in the y direction is constant. The laminating liquid, liquid adhesive, or the like used when printing or laminating the insulating layer 2c is dispersed and soaked in the electronic element mounting substrate. Because the size of the opening portion 5 of the insulating layer 2c in the y direction is constant for dispersing and soaking, the difference in concentration due to diffusion of the laminating liquid, the liquid adhesive, or the like dispersed in the electronic element mounting substrate 1 can be reduced. This makes it possible to reduce the occurrence of defects such as cracking or disconnection caused by a reduction in the strength of the insulating layer.

Figure 11B:
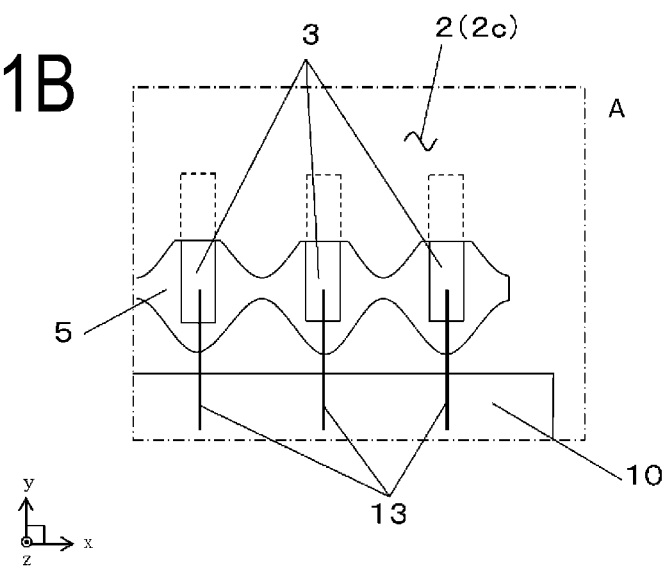

In the embodiment illustrated in FIG. 11B, the opening portion 5 of the insulating layer 2c decreases in size toward the electrode pads 3. By the opening portion 5 of the insulating layer 2c being small, this makes it further possible to effectively reduce the amount of scratching, adherence of foreign matter, and the like to the surface of the electrode pads 3 caused by handling when mounting the electronic element 10 and lid 12. In a case where the amount of scratching, adhesion of foreign matter, and the like on the electrode pads 3 is reduced, it is possible to reduce the inability to mount the connecting members 13 and degradation of the strength of the connecting members 13.

Fifth Embodiment

The electronic element mounting substrate 1 according to the fifth embodiment of the present disclosure will be described next with reference to FIG. 12.

The electronic element mounting substrate 1 includes the mounting region 4 located on an upper surface of the substrate 2a, the mounting region 4 being where the electronic element 10 is mounted. In this example, the substrate 2a may include at least one insulating layer 2c on the first protrusion portion 2aa and/or the second protrusion portion 2ab. For example, the substrate 2a may include the first substrate portion 2d and the second substrate portion 2e in the same manner as in other embodiments. In this example, the second substrate portion 2e is formed by the insulating layer 2c, and the insulating layer 2c of the example illustrated in FIG. 12 is formed by a first layer 2ca (hereinafter, also referred to as first insulating layer 2ca) and a second layer 2*cb* (hereinafter, also referred to as second insulating layer 2*cb*) located on the upper surface of the first layer 2*ca*.

Figure 12A:
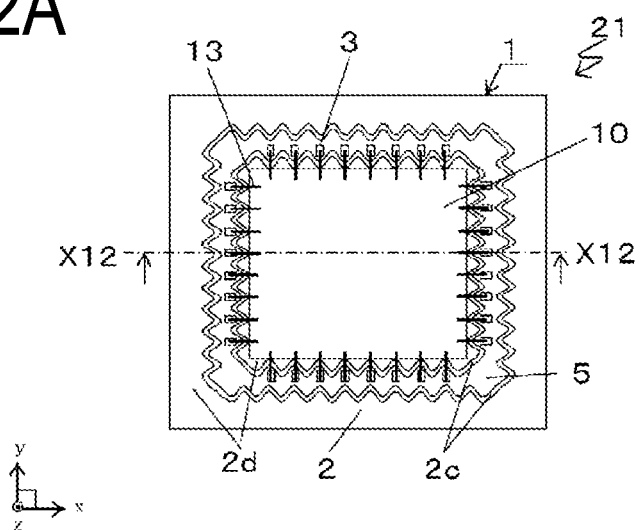
FIG. 12A is a top view illustrating the outer appearance of an electronic element mounting substrate and an electronic device according to a fifth embodiment of the present disclosure.
Figure 12B:
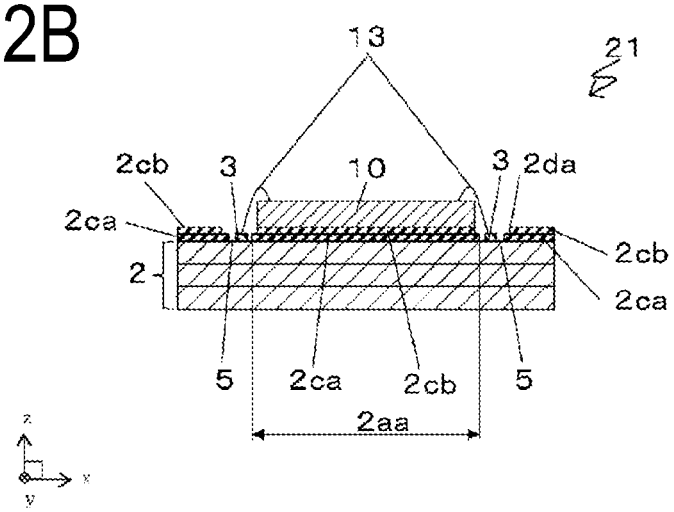
FIG. 12B is a vertical cross-sectional view taken along line X12-X12 in FIG. 12A.

By providing the first insulating layer 2*ca* and the second insulating layer 2*cb* positioned back from the outer edge of the first insulating layer 2*ca* on the upper surface of the first insulating layer 2*ca*, the outer periphery of the insulating layer is given a stepped-shape as illustrated in FIG. 12. Thus, the laminating liquid, liquid adhesive, or the like used when printing or laminating is dispersed and soaked in the electronic element mounting substrate 1. This dispersion and soaking makes it possible to reduce the occurrence of defects such as cracking or disconnection caused by a reduction in the strength of the insulating layer.

Furthermore, as in the example illustrated in FIG. 12, a step can be provided with the outer edge portion of the first insulating layer 2*ca* and the outer edge portion of the second insulating layer 2*cb*. That is, the outer edge of the first layer 2*ca* may be larger than the outer edge of the second layer 2*cb*. Here, the first layer 2*ca* may be inserted a considerable amount between the plurality of electrodes 3. In a case where the step portion is in the vicinity of the mounting region 4, the bonding area of the adhesive used when mounting the 10 electronic elements is increased by the amount of the step, thereby improving the bonding strength. In addition, since the step is in the Z-axis direction, it is possible to improve the bonding strength to the upper side.

In a case where the step portion provided at the outer edge portion of the first insulating layer 2*ca* and the outer edge portion of the second insulating layer 2*cb* is near a location where the bonding member 14 for joining to the lid 12 is located, the bonding strength of the bonding member 14 can be improved in the same manner as described above.

Furthermore, an upper end of the first insulating layer 2*ca* is located lower than an upper end of the plurality of electrode pads 3, and an upper end of the second insulating layer 2*cb* is located higher than an upper end of the plurality of electrode pads 3. In this case as well, the likelihood of disconnection of the plurality of electrodes 3 can be reduced while maintaining mechanical strength. Here, with the electrodes 3 exposed, the laminating liquid or the like used when printing or laminating is further dispersed and soaked in the electronic element mounting substrate. This dispersion and soaking of the laminating liquid, liquid adhesive, or the like makes it possible to reduce the occurrence of defects such as cracking or disconnection caused by a reduction in the strength of the insulating layer.

An upper end of the second insulating layer 2*cb* is located higher than an upper end of the plurality of electrode pads 3. Regardless of the shape of the second insulating layer 2*cb* in a top view, by locating the upper end of the second insulating layer 2*cb* higher than the upper end of the plurality of electrode pads 3, it is possible to reduce the amount of scratching, adherence of foreign matter, and the like to the surface of the electrode pads 3 caused by handling when mounting the electronic element 10 and lid 12. In a case where the amount of scratching, adhesion of foreign matter, and the like on the electrode pads 3 is reduced, it is possible to reduce the inability to mount the connecting members 13 and degradation of the strength of the connecting members 13. Furthermore, it is also possible to further add a third insulating layer 2*cc* above the second insulating layer 2*cb* in addition to the first insulating layer 2*ca* and the second insulating layer 2*cb* located on the upper surface of the first insulating layer 2*ca*. This achieves an effect the same as the effect in the case of two insulating layers described above.

The present disclosure is not limited to the above-described embodiments, and various modifications can be made to numerical values and the like. Further, for example, in the examples illustrated in the respective figures, the electrode pads 3 have a rectangular shape in a top view, but may be circular or have another polygonal shape. The arrangement, number, and shape of the electrode pads 3, the mounting method of the electronic element, and the like in the above-described embodiments are not specified. Note that various combinations of characteristic portions of the above-described embodiments are not limited to the examples in the above-described embodiments. For example, the protrusion portion need not be square and the corners may be rounded.

REFERENCE SIGNS LIST

1 Electronic element mounting substrate
2 Base
2*a* Substrate
2*aa* First protrusion portion
2*ab* Second protrusion portion
2*b* Frame body
2*c* Insulating layer
2*ca* First insulating layer (first layer)
2*cb* Second insulating layer (second layer)
2*cc* Third insulating layer
2*d* First substrate portion
2*da* Upper surface
2*e* Second substrate portion
3 Electrode (electrode pad)
4 Mounting region
5 Opening portion
10 Electronic element
12 Lid
13 Connecting member (for an electronic element)
14 Bonding member (for bonding a lid)
21 Electronic device
31 Electronic module
32 Casing

The invention claimed is:

1. An electronic component mounting substrate, comprising:
   a substrate having an upper surface including a first edge and a second edge that do not intersect with each other;
   a plurality of first electrodes arranged along the first edge on the upper surface;
   a plurality of second electrodes arranged along the second edge on the upper surface; and
   a plurality of third electrodes and a plurality of fourth electrodes on the upper surface, wherein
      the upper surface has a protrusion portion located between the plurality of first electrodes and the plurality of second electrodes in a top view, a first step portion extending along the first edge and lower than the protrusion portion, and a second step portion extending along the second edge and lower than the protrusion portion, the protrusion portion includes an electronic component mounting area,
      the plurality of first electrodes are located on the first step portion,
      the plurality of second electrodes are located on the second step portion,
      the upper surface has a third edge and a fourth edge that intersect the first edge and the second edge, respectively, and has a third step portion extending along the third edge and lower than the protrusion portion and a fourth step portion extending along the fourth edge and lower than the protrusion portion,
the plurality of third electrodes are located on the third step portion, and
the plurality of fourth electrodes are located on the fourth step portion.

2. The electronic component mounting substrate according to claim 1, wherein the protrusion portion includes a first outer edge portion extending in a direction of alignment of the plurality of first electrodes and a second outer edge portion extending in a direction of alignment of the plurality of second electrodes, and the first outer edge portion and the second outer edge portion are meandering.

3. The electronic component mounting substrate according to claim 2, wherein the protrusion portion includes a third outer edge portion extending in a direction of alignment of the plurality of third electrodes and a fourth outer edge portion extending in a direction of alignment of the plurality of fourth electrodes, and the third outer edge portion and the fourth outer edge portion are meandering.

4. The electronic component mounting substrate according to claim 1, wherein
the protrusion portion includes a first outer edge portion extending in a direction of alignment of the plurality of first electrodes and a second outer edge portion extending in a direction of alignment of the plurality of second electrodes,
the first outer edge portion has a portion extending between adjacent two of the plurality of first electrodes in the top view, and
the second outer edge portion has a portion extending between adjacent two of the plurality of second electrodes in the top view.

5. The electronic component mounting substrate according to claim 1, wherein on the upper surface, an area which includes the electronic component mounting area between the first step portion and the second step portion is plane from the first step portion to the second step portion.

6. The electronic component mounting substrate according to claim 1, wherein
an upper end of each of the plurality of the first electrodes is lower than an upper end of the protrusion portion, and
an upper end of each of the plurality of the second electrodes is lower than the upper end of the protrusion portion.

7. An electronic device comprising:
the electronic component mounting substrate according to claim 1; and
an electronic element mounted on the electronic component mounting substrate.

8. An electronic component mounting substrate, comprising:
a substrate having an upper surface including a first edge and a second edge that do not intersect with each other;
a plurality of first electrodes arranged along the first edge on the upper surface; and
a plurality of second electrodes arranged along the second edge on the upper surface, wherein
the upper surface has a first groove portion extending along the first edge, a second groove portion extending along the second edge, and an electronic component mounting area located between the first groove portion and the second groove portion,
the plurality of first electrodes are located on a bottom surface of the first groove portion,
the plurality of second electrodes are located on a respective bottom surface of the second groove portion,
a portion of the first electrode is buried in a side wall of the first groove portion, and
a part of the second electrode is buried in a side wall of the second groove portion.

9. The electronic component mounting substrate according to claim 8, wherein
the first groove portion includes:
a first opening that exposes at least a part of each of the plurality of first electrodes; and
a pair of first outer edge portions that define an outer edge of the first opening and that extend in a direction of alignment of the plurality of first electrodes,
the second groove portion includes:
a second opening that exposes at least a part of each of the plurality of second electrodes; and
a pair of second outer edge portions that define an outer edge of the second opening and that extend in a direction of alignment of the plurality of second electrodes,
one of the pair of first outer edge portions is meandering in a top view, and
one of the pair of second outer edge portions is meandering in the top view.

10. The electronic component mounting substrate according to claim 9, wherein
the other of the pair of first outer edge portions is meandering in the top view, and
the other of the pair of second outer edge portions is meandering in the top view.

11. The electronic component mounting substrate according to claim 8, wherein
the first groove portion includes: a first opening that exposes at least a part of each of the plurality of first electrodes; and a pair of first outer edge portions that define an outer edge of the first opening and that extend in a direction of alignment of the plurality of first electrodes,
the second groove portion includes: a second opening that exposes at least a part of each of the plurality of second electrodes; and a pair of second outer edge portions that define an outer edge of the second opening and that extend in a direction of alignment of the plurality of second electrodes,
one of the pair of first outer edge portions has a portion extending between adjacent two of the plurality of first electrodes in a top view, and
one of the pair of second outer edge portions has a portion extending between adjacent two of the plurality of second electrodes in the top view.

12. The electronic component mounting substrate according to claim 11, wherein
the other of the pair of first outer edge portions has a portion extending between said adjacent two of the plurality of first electrodes in the top view, and
the other of the pair of second outer edge portions has a portion extending between said adjacent two of the plurality of second electrodes in the top view.

13. The electronic component mounting substrate according to claim 8, wherein an upper end of each of the plurality of the first electrodes is lower than an upper end of the electronic component mounting area, and
an upper end of each of the plurality of the second electrodes is lower than the upper end of the electronic component mounting area.

14. An electronic device comprising:

the electronic component mounting substrate according to claim 8; and an electronic element mounted on the electronic component mounting substrate.

* * * * *